United States Patent
Sugai et al.

(10) Patent No.: US 6,184,623 B1
(45) Date of Patent: Feb. 6, 2001

(54) METHOD FOR CONTROLLING PLASMA-GENERATING HIGH FREQUENCY POWER, AND PLASMA GENERATING APPARATUS

(75) Inventors: Hideo Sugai, Kasugai; Seiichi Takasuga; Naoki Toyoda, both of Takarazuka, all of (JP)

(73) Assignees: Nissin Inc., Takarazuka (JP); Nagoya University, Nagoya (JP)

( * ) Notice: Under 35 U.S.C. 154(b), the term of this patent shall be extended for 0 days.

(21) Appl. No.: 09/357,849

(22) Filed: Jul. 21, 1999

(30) Foreign Application Priority Data

Jul. 23, 1998 (JP) .................................................. 10-208128
Mar. 5, 1999 (JP) .................................................. 11-058635

(51) Int. Cl.[7] .............................. H05B 31/26; H01J 7/24
(52) U.S. Cl. ..................... 315/111.21; 73/30.04;
324/663; 315/111.81; 118/723 I; 118/723 AN;
118/723 MW
(58) Field of Search ..................................... 324/109, 71.3,
324/663; 73/30.04, 30.01; 315/111.21, 111.41,
111.51, 111.81, 111.91; 118/723 AN, 723 MW,
723 ME, 723 MR, 723 I, 723 IR

(56) References Cited

U.S. PATENT DOCUMENTS 3,614,606 * 10/1971 Schmidt .............................. 324/61 R

* cited by examiner

Primary Examiner—Michael B Shingleton
(74) Attorney, Agent, or Firm—Arent Fox Kintner Plotkin & Kahn, PLLC

(57) ABSTRACT

A plasma generating apparatus and a method for controlling plasma-generating high frequency power capable of appropriately and easily controlling plasma density over the long term are disclosed. Measuring high frequency power is supplied to plasma through a dielectric tube. Apart from a supply system of plasma-generating high frequency power, there is provided a plasma density information obtaining section having long lifetime no hot filament. The plasma density information obtaining section obtains the plasma density information by measuring a physical amount related to reflection or absorption of the high frequency power. An actually measured plasma density monitored by the plasma density information obtaining section from moment to moment and a target plasma density held in a plasma density setting section are compared. Based on this compared result, an impedance matching device is changed, and an impedance matching state between the electric source side and the plasma side, thereby appropriately controlling the generating high frequency power output from the high frequency electric source.

16 Claims, 15 Drawing Sheets

METHOD FOR CONTROLLING PLASMA-GENERATING HIGH FREQUENCY POWER, AND PLASMA GENERATING APPARATUS

BACKGROUND OF THE INVENTION (1) Field of the Invention

The present invention relates to a plasma generating apparatus and a method for controlling plasma-generating high frequency power to be supplied to plasma, for use in a producing process of a thin film component, a particle beam source or an analysis apparatus, and more particularly, to a technique for appropriately and easily control the plasma density.

(2) Description of the Related Art

In recent years, the use of plasma is increased. In a producing process of a thin film component, using high-frequency plasma generated by high-frequency power (high-frequency electric power) in a range from a RF frequency band of about 10 MHz to a micro frequency band of 2.45 GHz, etching process or CVD (chemical-vapor deposition) are conducted. In such a plasma application technique, it is extremely important for conducting appropriate process to correctly control the plasma density.

The plasma density in a conventional plasma generating apparatus is controlled by controlling plasma-generating high frequency power in the following manner. The plasma-generating high frequency power is supplied from a high frequency electric source to plasma through an impedance matching device. A portion of the high frequency power that was not absorbed by the plasma and reflected and returned to the high frequency electric source side, i.e., reflected power is detected. The matching state of the impedance between the electric source side and the plasma is adjusted by always automatically controlling the impedance matching device such that the reflected power becomes minimum, thereby stabilizing the plasma density to keep the processing condition constant.

However, there is a problem that the conventional control of the plasma density is not appropriate. The plasma density is substantially proportional to net electric power applied to plasma, but even if the impedance matching device is automatically adjusted such that the reflected power of the high frequency power becomes minimum, only high frequency power including loss between the impedance matching device and an ignition electrode (discharge antenna) becomes constant, net electric power applied to the plasma does not always become constant. Therefore, there is an unavoidable limit in the conventional control method of the plasma density in which the plasma-generating high frequency power is controlled based on the reflection amount of high frequency power that is not absorbed by plasma and reflected and returned.

To solve the above problem, it is considered that the plasma density is controlled based on the actually measured plasma density. In the case of typical plasma comprising monovalent positive ion and electron, the positive ion density and the electron density are substantially equal to each other due to the properties particular to plasma that electrically neutral state is maintained, the electron density is generally called as plasma density. That is, the electron density in the plasma is substantially equal to the plasma density. Conventionally, as a method for measuring the electron density in plasma, there is an electron beam irradiation type plasma vibration probe which was developed relatively recently, in addition to a Langmuir/probe method and a microwave interference measuring method. It can be considered that electron density in plasma is measured by these method, the plasma-generating high frequency power is controlled based on the measured electron density.

The Langmuir/probe method is a method in which a metal probe is directly exposed in plasma an in this state, direct current bias voltage, or direct current bias voltage on which high-frequency voltage is superposed is applied to the metal probe, and based on the current value flowing through at that time, electron density is measured. The microwave interference measuring method is a method in which a chamber for generating plasma is provided with windows which are opposed to each other with plasma positioned therebetween, microwave (e.g., single color laser light) is radiated to the plasma through one of the windows, and the microwave ejected from the other window is detected, and electron density is obtained based on phase contrast between the radiated microwave and ejected microwave. The electron beam irradiation type plasma vibration method is a method in which a hot filament is placed in a chamber, and based on frequency of plasma oscillations generated when electron beam is irradiated to the plasma from the hot filament, electron density is obtained.

However, the Langmuir/probe method has a problem that the measuring can not be continued for a long time. This is because that stains comprising insulative films are adhered on a measured metal probe within a short time, the current value flowing through the metal probe is varied, and accurate measurement can not be continued soon. In order to remove the stains adhered on the metal probe surface, a method in which negative bias voltage is applied to the metal probe to carry out sputter-removing method using ion, and a method in which the metal probe is allow to glow to evaporate and remove the stains have been attempted, but the effect is poor, and the problem is not solved by these methods.

Further, the microwave interference measuring method has a problem that the measurement can not be conducted easily. This is because a large-scale and expensive apparatus and adjustment of microwave transmission path are necessary, the phase contrast between the radiated microwave and ejected microwave is small and thus, it is difficult to measure precisely.

Furthermore, in the case of the electron beam irradiation type plasma vibration probe method, in addition to anxiety of plasma atmosphere contamination due to tungsten which is evaporated from the hot filament, there is a problem of anxiety of interruption of measurement caused by break of hot filament. Especially in the case of plasma using oxygen or chlorofluorocarbons gas, the hot filament is easily cut or broken, and it is necessary to frequently exchange the filament, it can not be said that this is practical.

SUMMARY OF THE INVENTION

In view of the above circumstances, it is an object of the present invention provide a plasma generating apparatus and a control method of plasma-generating high frequency power capable of appropriately and easily controlling plasma density over the long term.

That is, a method for controlling plasma-generating high frequency power of the present invention comprises the steps of:

supplying, to plasma, high frequency power for measuring plasma density information;

measuring a physical amount indicating reflection or absorption state of the high frequency power by plasma load;

obtaining the plasma density information based on a measured result of the physical amount; and controlling the plasma-generating high frequency power based on the obtained plasma density information.

According to the above method of the invention, with respect to the high frequency power for measuring plasma density information to be supplied to plasma apart from high frequency power for generating plasma, the physical amount indicating absorption state by the plasma load is measured, and based on the plasma density information obtained from the measured result of this physical amount, the plasma-generating high frequency power is controlled. The plasma-generating high frequency power is controlled in accordance with the plasma density information obtained by a measuring system that is quite different from the supply system of the plasma-generating high frequency power. As a result, the monitored result of the actual plasma density excellently reflects the control of the high frequency power, and the plasma density can be controlled appropriately. Further, since the high frequency power is supplied to the plasma to obtain the plasma density information in the present invention, even if stains comprising insulative films are adhered to the antenna which supplies the high frequency power, its influence is small, and it is possible to control the plasma-generating high frequency power based on the precise plasma density information. Further, for measuring the plasma density information, all that is necessary is only to supply the high frequency power to the plasma, and to measure the physical amount (e.g., to measure reflection amount of high frequency power or the impedance value of the plasma load) indicating the reflection or the absorption state of the high frequency power by the plasma load, the information is measured easily without using hot filament, and the plasma density can easily be controlled.

In the method of the invention, it is preferable that the high frequency power for measuring the plasma density information to the plasma through a dielectric division wall. With this structure, since the dielectric division wall exists between the plasma side to be controlled and the supply side of the plasma density information measuring high frequency power, no foreign object enters to the plasma from the supply side of the high frequency power, the plasma can be maintained clean. Further, the high frequency power supply side is prevented from being damaged by the plasma. Even if the stains comprising insulative films are adhered to the surface of the dielectric division wall, since the insulative films are dielectric, the thickness of the dielectric division wall may be slightly varied, and no substantial variation is not caused in the measuring system, and measuring interference due to the stains of insulative films can be avoided.

In the method of the invention, the physical amount indicative of reflection or absorption state of the high-frequency power by plasma load is measured by measuring an electric current amount of a high-frequency amplifier for supplying high-frequency power. For example, the physical amount is measured by measuring the electric current amount of a high frequency power supplying high frequency amplifier. Since electric current in accordance with a degree of reflection or absorption of the high frequency power by the plasma load flows through the high frequency power supplying high frequency amplifier, it is possible to easily measure the physical amount indicative of the reflection or the absorption state of the high frequency power by measuring the electric current amount.

In the method of the invention, as the plasma density information, plasma absorption frequency at which strong absorption of high frequency power is caused due to the plasma density is obtained from the measured result of the physical amount for example. The plasma absorption frequency is a frequency at a location where a resonant and outstanding absorption is caused as the measured result of the physical amount, the plasma density information correctly corresponding to the actual plasma density is easily obtained.

In the method of the invention, it is preferable that the plasma-generating high frequency power is supplied to plasma from a high frequency electric source through an impedance matching system, and the impedance matching system is controlled based on the plasma density information, thereby adjusting the impedance matching state between the electric source side and the plasma side. The adjustment of the impedance matching system provides a strong high frequency power control effect (control effect appears easily), the plasma-generating high frequency power can smoothly be controlled.

Further, a plasma generating apparatus of the present invention comprises:

a plasma generating chamber;

a plasma generating ignition electrode disposed in the chamber;

a high frequency electric source for outputting plasma generating high frequency power to be supplied to the ignition electrode;

plasma density information obtaining means for supplying plasma density information measuring high frequency power in the chamber to measure a physical amount indicating absorption state of high frequency power by plasma load, thereby obtaining the plasma density information; and high frequency power control means for controlling the plasma generating high frequency power based on the information obtained by the plasma density information obtaining means.

According to the apparatus of the invention, the plasma-generating high frequency power in accordance with the actual plasma density is controlled, and the plasma density is appropriately and easily controlled over the long term.

In the apparatus of the invention, it is preferable that the plasma density information obtaining means supplies the plasma density information measuring high frequency power to the plasma in the chamber through a dielectric division wall. With this structure, the plasma is not contaminated, and the high frequency power supply side is prevented from being damaged by the plasma.

In the apparatus of the invention, said plasma density information obtaining means obtains, as the plasma density information, plasma absorption frequency at which strong absorption of high frequency power is caused due to the plasma density from the measured result of the physical amount. According to this example, the plasma-generating high frequency power in accordance with the actual plasma density is correctly controlled, and the plasma density is appropriately and easily controlled over the long term.

In the apparatus of the invention, it is preferable that the high frequency power control means is provided an impedance matching device, the impedance matching device is controlled based on the plasma density information, thereby adjusting the impedance matching state between the electric source side and the plasma side. According to this example, the plasma-generating high frequency power in accordance with the actual plasma density is smoothly controlled, and the plasma density is appropriately and extremely easily controlled over the long term.

In the apparatus of the invention, it is preferable that the apparatus further comprises a dielectric tube inserted into the plasma generating chamber and having a closed tip end, an antenna accommodated in the tube at its tip end side for radiating high-frequency power, and a cable accommodated in the tube at its rear side and connected to the antenna for transmitting the high-frequency power, wherein the plasma density information measuring high frequency power is supplied from an antenna in the tube to plasma through a tube wall of the dielectric tube as a dielectric division wall.

With this structure, the plasma density information measuring high frequency power is supplied to the plasma from the antenna through the tube wall (division wall) of the dielectric tube via the cable of the plasma density information measuring probe, and the reflected power received by the antenna is taken out through the cable. Further, since the range where the high-frequency power from the antenna influences the plasma is not so wide, it is also possible to obtain a local plasma density information if the amount of the high-frequency power is adjusted. That is, by the plasma density information measuring probe, it is possible to easily prepare necessary state for measuring the plasma density information so that the measurement can easily be carried out, and it is possible to allow the spatial resolution to appear.

In the apparatus of the invention, a plurality of antennas are accommodated in the dielectric tube such that distances between a tip end of the tube and the antennas are different from one another, the plasma density information obtaining means obtains plasma absorption frequencies at which strong absorption of high frequency power are caused due to plasma density from the measured result of the physical amount obtained in each of the antennas, and among the plasma absorption frequencies, one having the common frequency is obtained as the plasma surface wave resonance frequency. With this structure, among the plasma absorption frequencies obtained for the antennas having difference distances from the tip end of the tube, if one of them having the common frequency is obtained, the plasma surface wave resonance frequency can easily be found.

In the apparatus of the invention, it is preferable that a plasma density information measuring probe is inserted in a chamber which generates plasma for forward and backward movement, and the probe is moved such that a tip end of the probe is pulled backward from a measuring position in the chamber to a retreat position in the vicinity of a wall surface of the chamber when measurement is not carried out. With this structure, since the probe is moved such that a tip end of the probe is pulled backward from a measuring position in the chamber to a retreat position in the vicinity of a wall surface of the chamber when measurement is not carried out, even if the plasma allows stains to adhered to the surface of the probe, it is possible to move the probe toward the plasma only when the measurement is carried out, and to prevent the probe from being contaminated.

In the apparatus of the invention, it is preferable that protecting means for blocking excessive plasma generating high-frequency power which enters the antenna in the probe is provided behind the plasma density information measuring probe. With this structure, when excessive plasma generating high-frequency power enters the antenna in the probe, the protecting means provided behind prevent the excessive high-frequency power, thereby preventing the apparatus from being destroyed. Especially when the generated plasma disappears unexpectedly, there is an adverse possibility that the high-frequency power for generating the plasma is directly placed on the antenna, and the probe control section is destroyed. However, this adverse possibility is overcome by the protecting means.

In the apparatus of the invention, it is preferable that the cable for transmitting high-frequency power comprises a conductor tube for a core wire and a shield, and an insulative ceramics material for filling a gap between the core wire and the conductor tube. According to this example, since the gap between the core wire and the conductor tube is filled with the heat-resistant insulative ceramics material, the heat-resistance of the cable is enhanced.

In the apparatus of the invention, it is preferable that a surface of the dielectric tube is coated with metal such that a measuring area of the dielectric tube is not coated. According to this structure, since the surface of the dielectric tube is coated with metal such that the measuring area of the dielectric tube is not coated, the local state of the measuring area that is not coated with metal is strongly reflected to the measured result, and the spatial resolution is enhanced.

In the apparatus of the invention, it is preferable that the antenna is extended closely along an inner surface of the dielectric tube. With this structure, since the high-frequency power irradiated from the antenna is effectively supplied to the plasma, the supply amount of the high-frequency power may be small, and the measuring precision is enhanced.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Preferred embodiments of the present invention will be explained in detail below with reference to the drawings.

Figure 1:
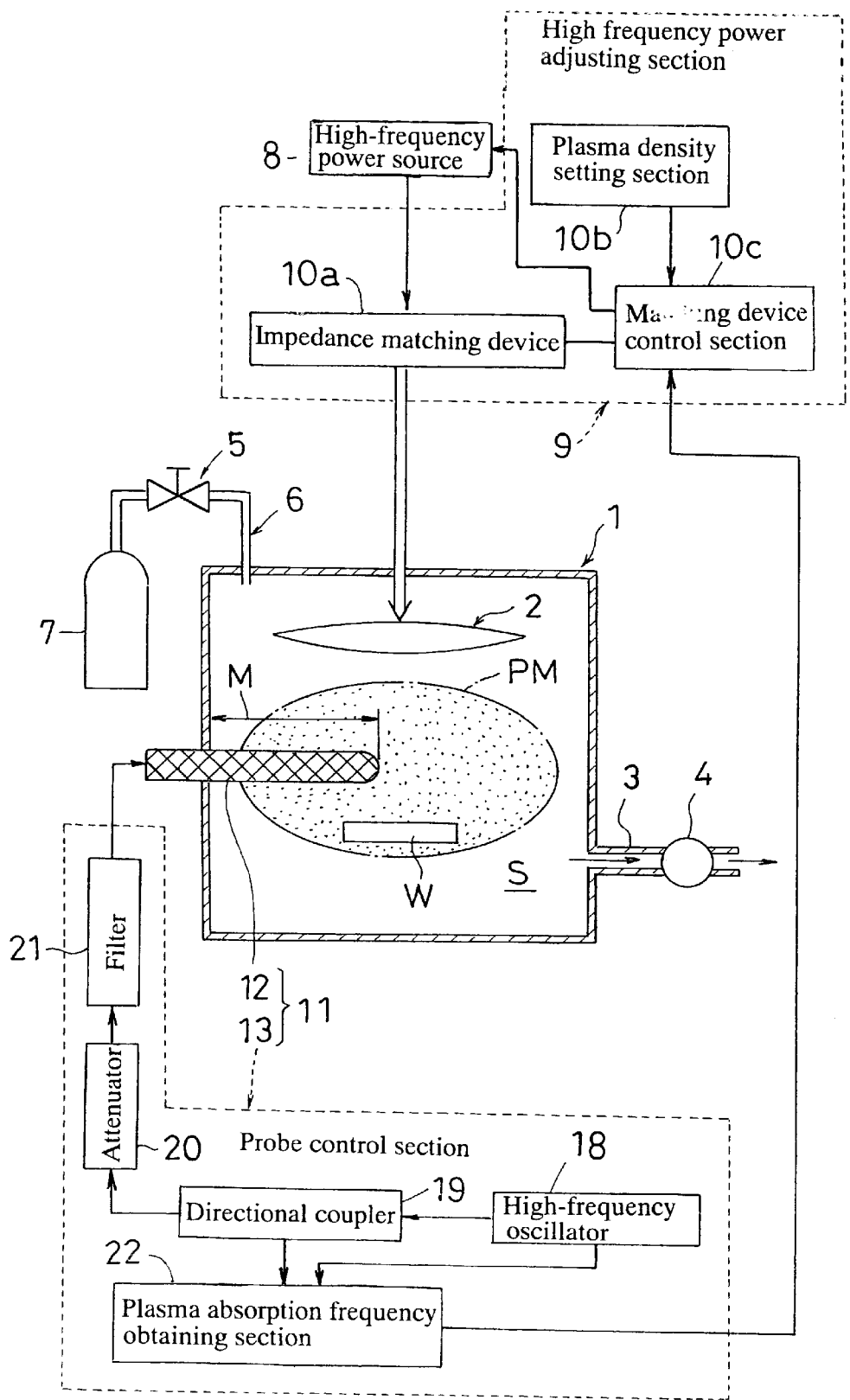
FIG. 1 is a block diagram showing a plasma processing system according to an embodiment of the present invention.
Figure 2:
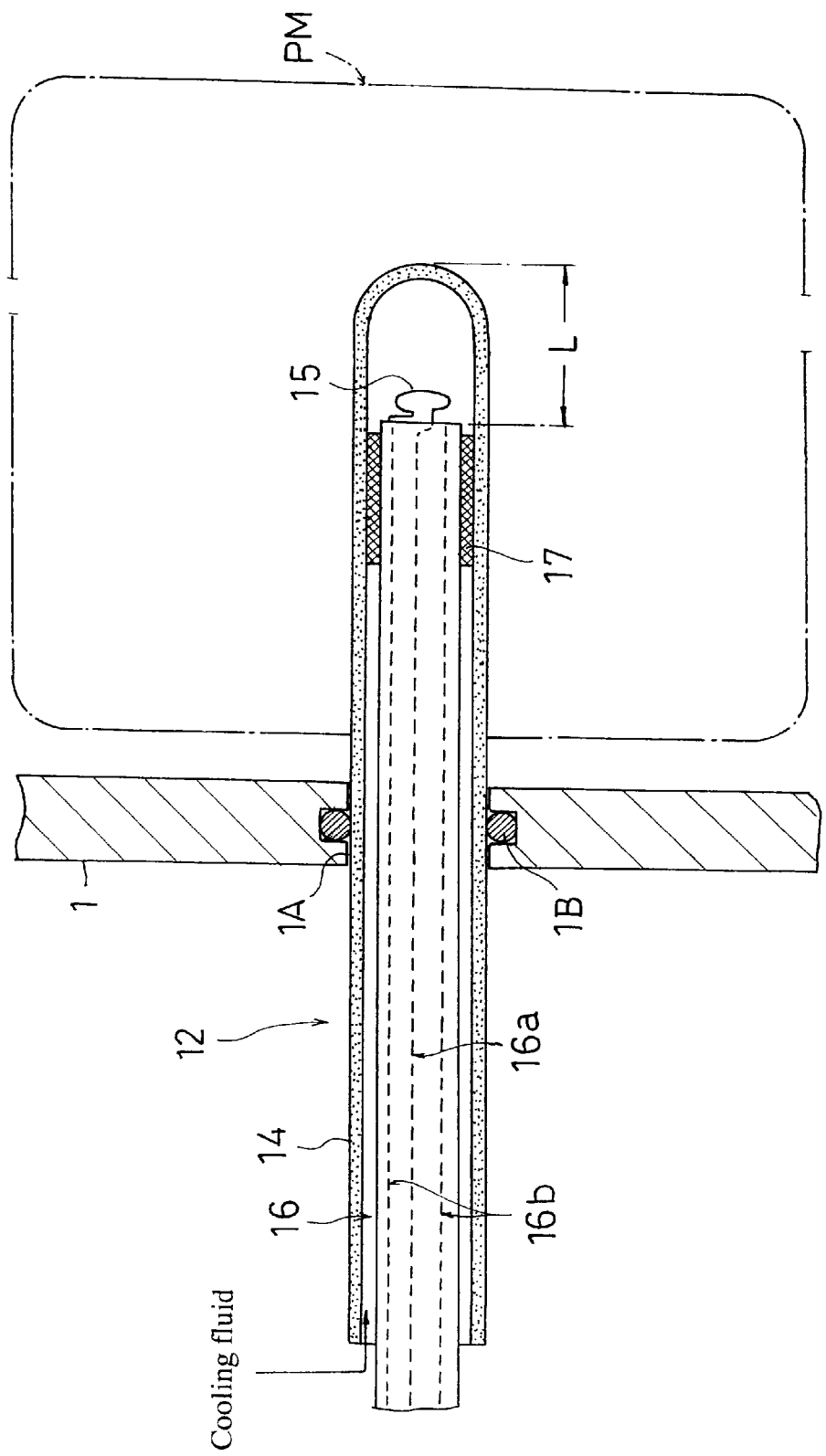
FIG. 2 is a vertical sectional view showing a measuring probe provided in a plasma density information obtaining section of the embodiment.
Figure 3:
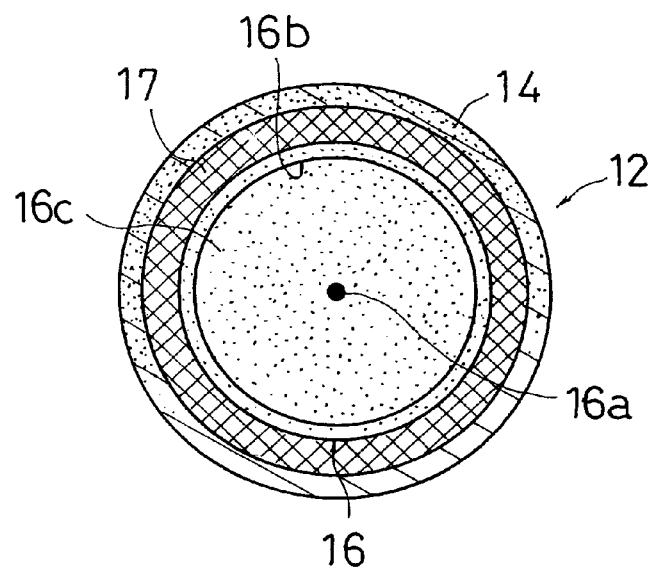
FIG. 3 is a transverse sectional view showing the measuring probe provided in the plasma density information obtaining section of the embodiment.

FIG. 1 is a block diagram showing a plasma processing system for carrying out one example of a control method of plasma-generating high frequency power of the present invention in which one example of a plasma generating apparatus of the invention is incorporated. FIG. 2 is a vertical sectional view showing structure of the plasma density information measuring probe (which will be omitted as "measuring probe" hereinafter) used in the embodiment. FIG. 3 is a transverse sectional view showing a structure of the measuring probe used in the embodiment.

As shown in FIG. 1, the plasma processing system of the embodiment comprises a stainless steel chamber 1 of about 10 cm diameter having a space S in which reactive plasma (which will be omitted as "plasma" hereinafter) PM is generated, an ignition electrode (ignition antenna) 2 disposed in the chamber 1 for generating plasma, a vacuum discharge pump 4 which is in communication with the space S of the chamber 1 through a discharge pipe 3, and a gas source 7 which is in communication with the space S of the chamber 1 through a gas supply pipe 6 provided therein with a flow rate adjusting valve 5. In addition, a board (not shown) of a work (object to be processed) W, and a transfer-in/transfer-out mechanism of the work W are also disposed in the chamber 1 of the system of the present embodiment.

Air in the space S of the chamber 1 is exhausted by the vacuum discharge pump 4 and the space S is kept at appropriate pressure. Atmospheric pressure in the space S when plasma PM is generated is in a range from some mTorr to some tens mTorr for example. Gas is supplied from the gas source 7 at appropriate flow rate. Examples of the gas to be supplied are argon, nitrogen, oxygen gas, fluorine gas, and chlorine gas. The gas flow rate set by the flow rate adjusting valve 5 is in a range from 10 to 100 cc/minute for example.

In the case of plasma of inductively coupled RF discharge plasma, an induction coil is used as the ignition electrode 2, and in the case of capacitive coupled RF discharge plasma, a flat electrode is used as the ignition electrode 2. Further, in the case of microwave discharge plasma in which frequency of high-frequency power is frequency of microwave band, a horn antenna, a slot antenna or an opened waveguide is used as the ignition electrode 2.

Provided outside the chamber 1 are a high-frequency electric source 8 for supplying plasma-generating high-frequency power, and a high frequency power control section 9 for controlling the plasma-generating high frequency power (which will be omitted to as "generating high frequency power" hereinafter) to be supplied to the ignition electrode 2.

The magnitude of the high-frequency power output from the high-frequency electric source 8 is in a range from about 1 to about 3 kW for example. The frequency of the high-frequency power should not be limited to particular frequency, but the frequency of the high-frequency power is usually in a range from RF band which is typically 13.56 MHz to a microwave band of about 900 MHz to 2.45 GHz.

The high frequency power control section 9 comprises an impedance matching device 10a for adjusting the impedance matching state between the high frequency electric source side and the plasma side, a plasma density setting section 10b for setting a target plasma density of plasma to be generated in the chamber 1, and a matching device control section 10c for controlling the impedance matching device 10a in accordance with a difference between the set target plasma density and an actually measured plasma density.

When frequency of high-frequency power is RF band frequency, a matching circuit in which inductance and capacitance are combined is used as the impedance matching device 10a. When frequency of high-frequency power is microwave band frequency, an EH tuner or a stub tuner is used as the impedance matching device 10a.

In the case of the system of the embodiment, as means of roughly grasping the plasma generating state, there are provided an output power monitor mechanism (not shown) for detecting the output amount of high frequency power output from the high frequency electric source 8, and a reflected power monitor (not shown) for detected the reflection amount of high frequency power that is not absorbed by the plasma load side and returned to the electric source side.

The work W is subjected to etching process or the CVD (chemical-vapor deposition) by plasma PM generated in this manner. The system of the embodiment is provided with a plasma density information obtaining section 11 for obtaining the plasma density information from moment to moment.

As shown in FIG. 1, the plasma density information measuring apparatus 11 of the embodiment comprises a measuring probe 12 mounted to a wall of the chamber 1, and a probe control section 13 disposed outside the chamber 1. A specific structure of the measuring probe 12 will be explained first.

As shown in FIGS. 2 and 3, the measuring probe 12 comprises a dielectric tube 14 whose tip end is closed and rear end is opened into atmosphere (outside air), a loop antenna 15 for radiating high-frequency power, a coaxial cable 16 connected to the loop antenna 15 for transmitting the high-frequency power to the loop antenna 15, and an aluminum conductor piece 17 for preventing leakage of radiated electromagnetic wave. The dielectric material forming the tube 14 is not particularly limited, but appropriate examples thereof are reinforced heat-resistant glass, quartz, and ceramic.

The loop antenna 15 and the coaxial cable 16 are accommodated in the tube 14 such that the loop antenna 15 comes first. The conductor piece 17 is disposed at a position slightly rearward of the loop antenna 15 such that a gap between the coaxial cable 16 and an inner surface of the tube 14. As a result, measuring error due to leakage of high-frequency power is avoided.

The measuring probe 12 is inserted and mounted from a through hole 1A provided in the wall of the chamber such that a tip end of the measuring probe 12 is located in the chamber 1. The plasma density at arbitrary position in plasma PM can be measured by appropriately setting the insertion amount of the measuring probe 12 into the chamber 1 (shown with symbol M in FIG. 1). An O-ring 1B is interposed between an outer peripheral surface of the probe 12 and the through hole 1A of the chamber 1 so that vacuum leakage is not caused by placement of the measuring probe 12.

As shown in FIG. 3, the coaxial cable 16 is of a general coaxial structure in which the fluoroplastic insulative material 16c is interposed between a core wire 16a and a shield wire 16b continuously surrounding the core wire 16a from its outside along the longitudinal direction. Cooling fluid such as air or nitrogen gas is forcibly sent into a gap between the tube 14 and the coaxial cable 16. As a result, measuring error which may be caused due to temperature rise of the tube 14 or the coaxial cable 16. As sending means of the cooling fluid, the following structure can be employed. For example, a thin tube (not shown) is inserted into the gap between the tube 14 and the coaxial cable 16, and a tip end of the thin tube is positioned near the conductor piece 17. The cooling fluid is sent to a deep portion of the tube 14 through the thin tube to cool the measuring probe 12. The cooling fluid is not limited to gas such as air, and may be liquid such as water.

Figure 5:
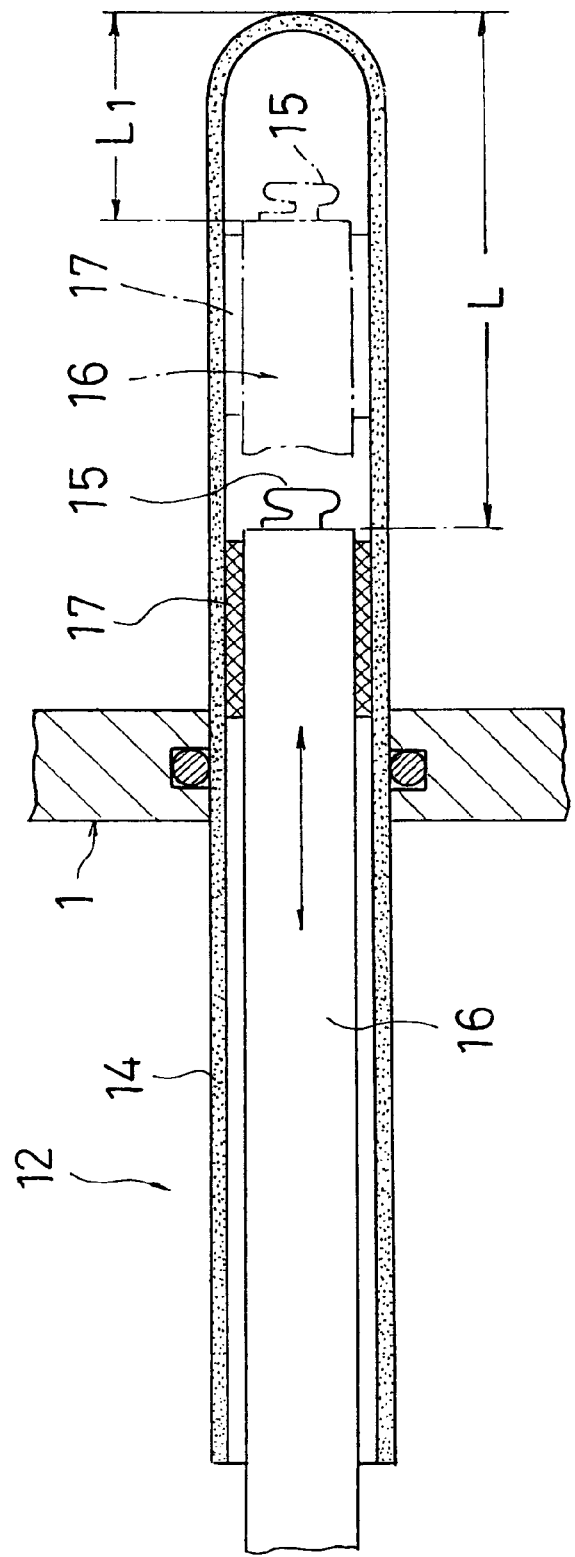
FIG. 5 is a sectional view showing a position changing state of a loop antenna in a measuring probe.

Further, as shown in FIG. 5, the loop antenna 15, the coaxial cable 16 and the conductor piece 17 are moved forward and backward as one unit by pulling or pushing the coaxial cable 16 in the longitudinal direction of the tube 14, so that the position of the loop antenna 15 is varied along the longitudinal direction of the tube 14. That is, with this measuring probe 12, the length L between the tip end of the tube 14 and a tip end of the conductor piece 17 including the loop antenna 15 can easily be varied.

Next, a specific structure of the probe control section 13 will be explained. The probe control section 13 comprises a swept-frequency high-frequency oscillator 18, a directional coupler 19, an attenuator 20, and a filter 21. These elements are connected to the measuring probe 12 in the order shown in FIG. 1. The high-frequency oscillator 18 outputs high-frequency power for measuring plasma density information of about 10 mW at frequency of 100 kHz to 3 GHz while automatically conducting swept-frequency. The high-frequency power output from the high-frequency oscillator 18 is transmitted to the measuring probe 12 through the directional coupler 19, the attenuator 20, and the filter 21 in this order.

On the other hand, the high-frequency power for measuring the plasma density information (which will be omitted as "measuring high frequency power" hereinafter) is not always emitted from the loop antenna 15 and absorbed by the plasma load, and some of the high-frequency power is not absorbed by the plasma load and reflected and returned. The reflection amount of the high-frequency power which is not absorbed by the plasma load and returned is detected by the directional coupler 19, and sent to a power reflection coefficient frequency characteristic obtaining section 22. High-frequency power frequency which is output from the high-frequency oscillator 18 is also sent to the power reflection coefficient frequency characteristic obtaining section 22.

The filter 21 removes high-frequency power for exciting plasma which is mixed into the probe control section 13 through the antenna 15. The attenuator 20 adjusts the amount of the measuring high-frequency power to be sent to the measuring probe 12.

Figure 4:
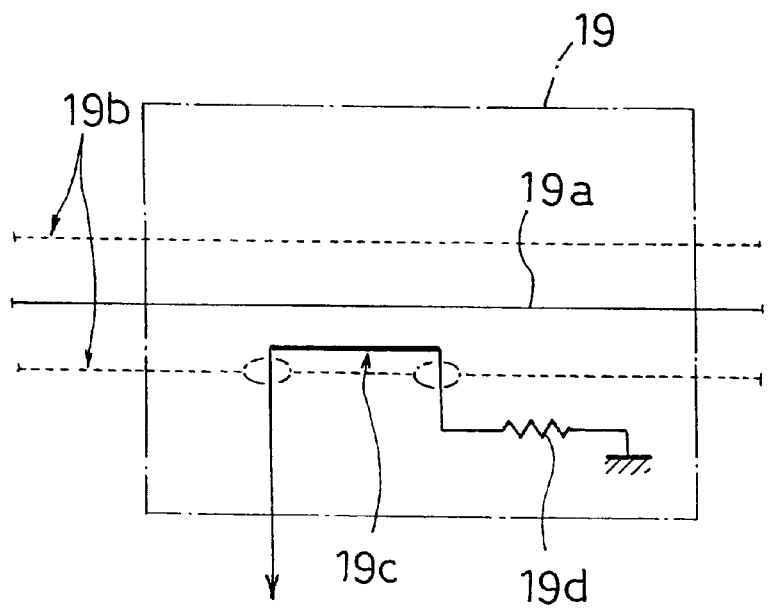
FIG. 4 is an equivalent circuit diagram of a directional coupler provided in the plasma density information obtaining section of the embodiment.

As shown in FIG. 4, the directional coupler 19 is of a coaxial structure comprising a core wire 19a and a shield wire 19b continuously surrounding the core wire 19a from its outside along the longitudinal direction. A short coupling line 19c is provided along the core wire 19a inside of the shield wire 19b. A side of the coupling line 19c closer to the high-frequency oscillator is grounded through a resistor 19d so that the high-frequency power reflection amount can be detected at the non-grounded side of the coupling line 19c.

The plasma absorption frequency obtaining section 22 obtains counter frequency variation of the measuring high-frequency power reflection coefficient based on the high-frequency power and the detected reflection amount thereof, and based on the obtained result, plasma absorption frequency at which strong absorption of the high frequency power is caused due to the plasma density. That is, in the plasma absorption frequency obtaining section 22, expression [detected reflection amount of high-frequency power/total output amount of high-frequency power (constant amount in this embodiment)] is calculated, and the measuring high-frequency reflection coefficient is obtained, and the obtained reflection coefficient is plotted in correspondence with frequency which is varied from moment to moment, so that the counter frequency variation of the measuring high-frequency power reflection coefficient is obtained.

When the reflection coefficient is largely reduced, this point is the absorption peak where strong high-frequency power absorption is caused due to the plasma density, and this absorption peak is plasma absorption frequency. The plasma absorption frequency obtaining section 22 detects this absorption peak automatically, and certifies the corresponding frequency as the plasma absorption frequency.

The plasma absorption frequency obtained by the plasma absorption frequency obtaining section 22 is constant correlation with the plasma density, this is effective plasma density information. In the case of the system of the embodiment, the plasma absorption frequency is surface wave resonance frequency f. The surface wave resonance frequency f directly corresponds to electron density $n_e$ in plasma which is substantially equivalent to plasma density, and this is more effective plasma density information.

Since the concrete measuring method of the plasma density information by this plasma density information obtaining section 11 is a new method that has been invented by the present inventors for the first time, more concrete and detailed measuring example will be explained so that this method can be understood more easily.

Atmosphere of the space S in the chamber 1 was adjusted to be argon 10 m Torr. Then, high-frequency power of 13.56 MHz was applied to the ignition electrode 2 from the high-frequency electric source 8 at the output amount of 1.2 kW, thereby generating reactive plasma PM in the space S.

The tube 14 of the measuring probe 12 is a Pyrex glass tube having outer diameter of 6 mm and dielectric constant of 4. The coaxial cable 16 is a semi-rigid cable of 50 Ω, and the conductor piece 17 is made of aluminum foil.

Figure 6:
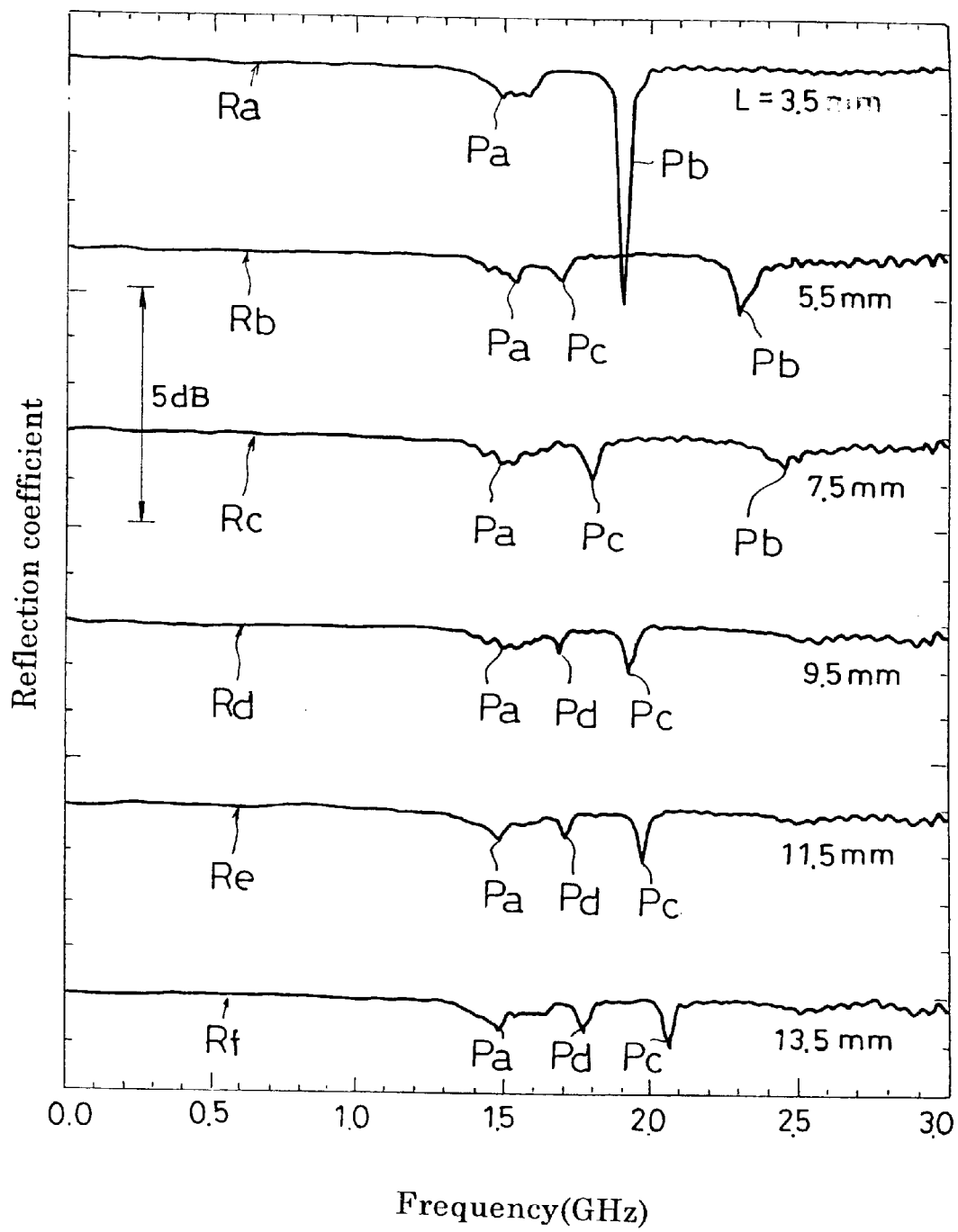
FIG. 6 is a graph showing reflection coefficient frequency characteristics of high-frequency power for measuring the plasma density information.

First, as shown in FIG. 2, the measuring probe 12 was set such that the length L from the base end of the loop antenna 15 and the tip end of the tube 14 became 3.5 mm. Then, high-frequency power of 10 mW to 3 GHz was output from 100 kHZ the high-frequency oscillator 18 while conducting swept-frequency. The reflection amount of the high-frequency power at that time was detected by the directional coupler 19, and the counter frequency variation of a reflection coefficient of high-frequency power shown with the uppermost curved line Ra in FIG. 6 is obtained.

Subsequently, as shown in FIG. 5, the set position of the measuring probe 12 was changed such that the length L from the base end of the loop antenna 15 and the tip end of the tube 14 became 5.5 mm, 7.5 mm, 9.5 mm, 11.5 mm and 13.5 mm. At each of the positions, the counter frequency variation of a reflection coefficient of high-frequency power is obtained in the same manner as that described above. The results are as shown with curved lines Rb to Rf in FIG. 6.

Figure 7:
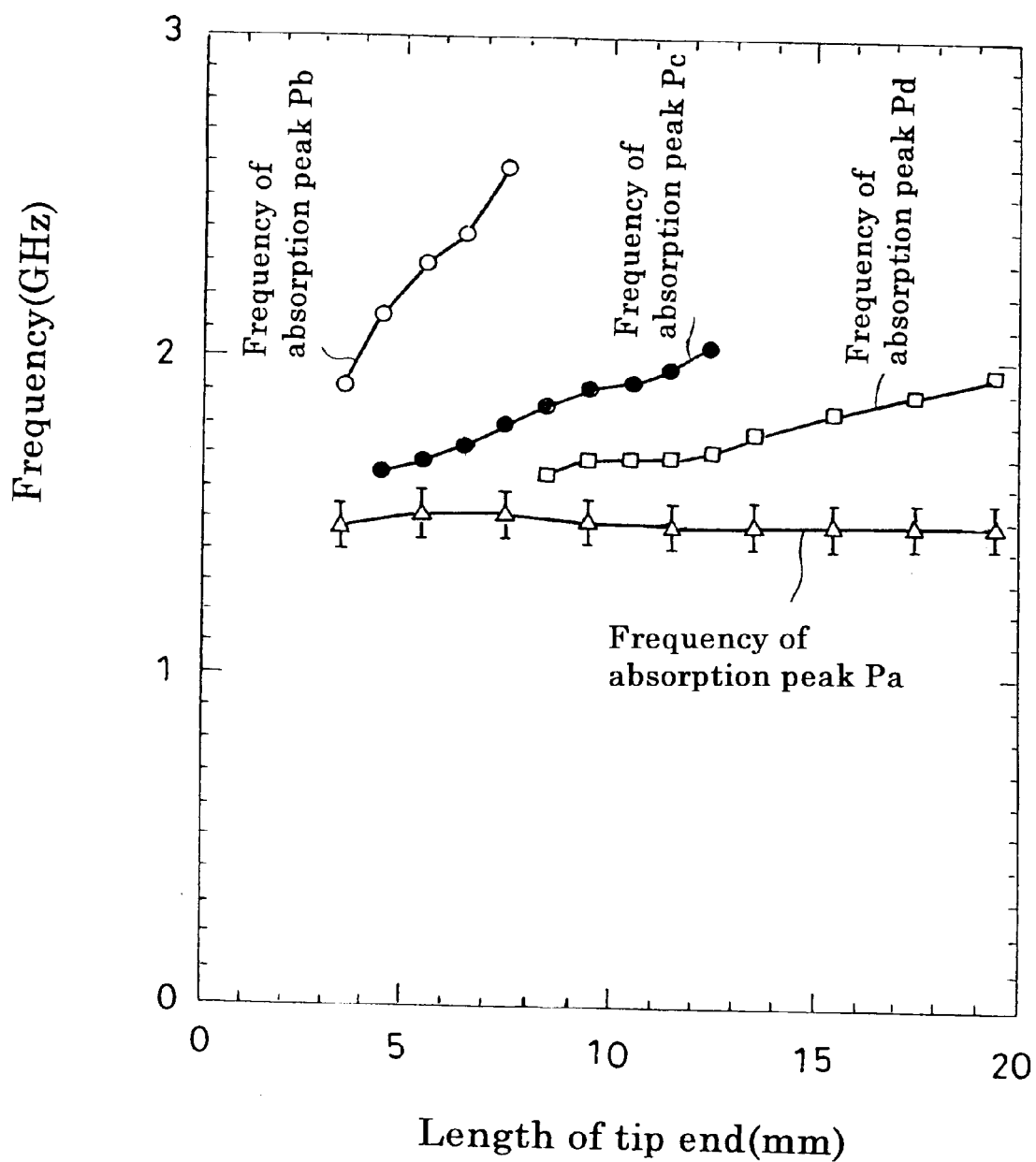
FIG. 7 is a graph showing the relationship between plasma absorption frequency and length of tip end of a tube of the measuring probe.

The curved lines Ra to Rf show some absorption peaks Pa to Pd indicative of strong absorption of the high-frequency plasma density information at the plasma load side. The frequency in the absorption peaks Pa to Pd is plasma absorption frequency. It is possible to grasp the characteristics of the generated plasma PM from the plasma absorption frequency. However, only the absorption peak Pa of the lowest frequency appears in a position of substantially constant frequency (1.5 GHz) even if the tip end length L is varied as shown in FIG. 7, and the same plasma absorption frequency is measured always. The plasma absorption frequency which does not depend of the tip end length L is plasma surface wave resonance frequency f ($=\omega/2\pi$). Therefore, in the case of the system of the embodiment, the plasma absorption frequency obtaining section 22 automatically obtains the lowest frequency of absorption peak as the plasma surface wave resonance frequency f, and sends the same to the mating device control section 10c of the high frequency power control section 9.

The plasma absorption frequency obtaining section 22 may further convert the plasma surface wave resonance frequency f into electron plasma angle frequency $\omega_p$ or electron density $n_e$, and may send the same to the matching device control section 10c. The plasma surface wave resonance frequency f can easily be converted by the following equation: Electron plasma angle frequency $\omega_p = \omega \times \sqrt{(1+\epsilon)}$, or electron density $n_e = \epsilon_o \cdot m_e \cdot \omega_p/e$ (wherein, $\omega_p$: electron plasma angle frequency, $\epsilon$: dielectric constant of the tube 14, $\epsilon_o$: vacuum dielectric constant, $m_e$: electron mass, e: electron amount). If the plasma surface wave resonance frequency f is 1.5 GHz, the electron plasma angle frequency $\omega_p$ is $2\pi \times 1.5 \times 10^9 \times \sqrt{(1+4)} = 3.35 \times 10^9$, and the electron density $n_e$ of plasma PM is $1.4 \times 10^{11}/cm^3$.

In the system of the embodiment, it is effective to provide a monitor for showing the plasma surface wave resonance frequency f, the electron plasma angle frequency $\omega_p$ and electron density $n_e$. The plasma density information can easily be seen visually in real time.

In the case of the present embodiment, the tube interposed between the plasma PM and the loop antenna 15 as well as the coaxial cable 16 prevents the loop antenna 15 and the coaxial cable 16 from being damaged by plasma PM. Furthermore, during the measurement, even if stains comprising insulative films are thinly adhered on the surface of the tube 14, since the insulative film is dielectric, the measuring system is not changed substantially, and variation is not caused in the measured result due to the stains of insulative film. Therefore, it is possible to continuously monitor the plasma density information over the long term.

Further, this method is carried out only by supplying the high-frequency power from the loop antenna 15 through the tube 14 to grasp the absorption phenomenon of the resonance high-frequency power which is easily measured. Therefore, plasma density information can be measured extremely easily. Furthermore, hot filament is not used, there is no need to be worry about atmosphere contamination by evaporated tungsten, and it is unnecessary to exchange the hot filament.

Next, a structure of the high frequency power control section 9 will be explained concretely. The matching device control section 10c of the high frequency power control section 9 which received the plasma density information from the plasma absorption frequency obtaining section 22 compares the target plasma density held in the plasma density setting section 10b and the plasma density information. If the difference therebetween is equal to or greater than a previously set range, the matching device control section 10c applies a variation corresponding to the magnitude of the difference to the impedance matching device 10a, thereby adjusting the impedance matching state between the high frequency electric source 8 side and the plasma PM side. That is, in the case of the present invention, the plasma-generating high frequency power is feedback controlled such that the difference between the target plasma density and the actually measured plasma density is eliminated.

In the plasma density setting section 10b, the target plasma density is set and held in the same data type as that of the plasma density information sent from the plasma absorption frequency obtaining section 22. That is, if the plasma density information is the plasma surface wave resonance frequency f, the target plasma density is also of the same data type as the plasma surface wave resonance frequency f. If the plasma density information is the electron plasma angle frequency $\omega_p$, the target plasma density is also of the same data type as the electron plasma angle frequency $\omega_p$. If the plasma density information is the electron density $n_e$, the target plasma density is also of the same data type as the electron density ne.

Figure 8:
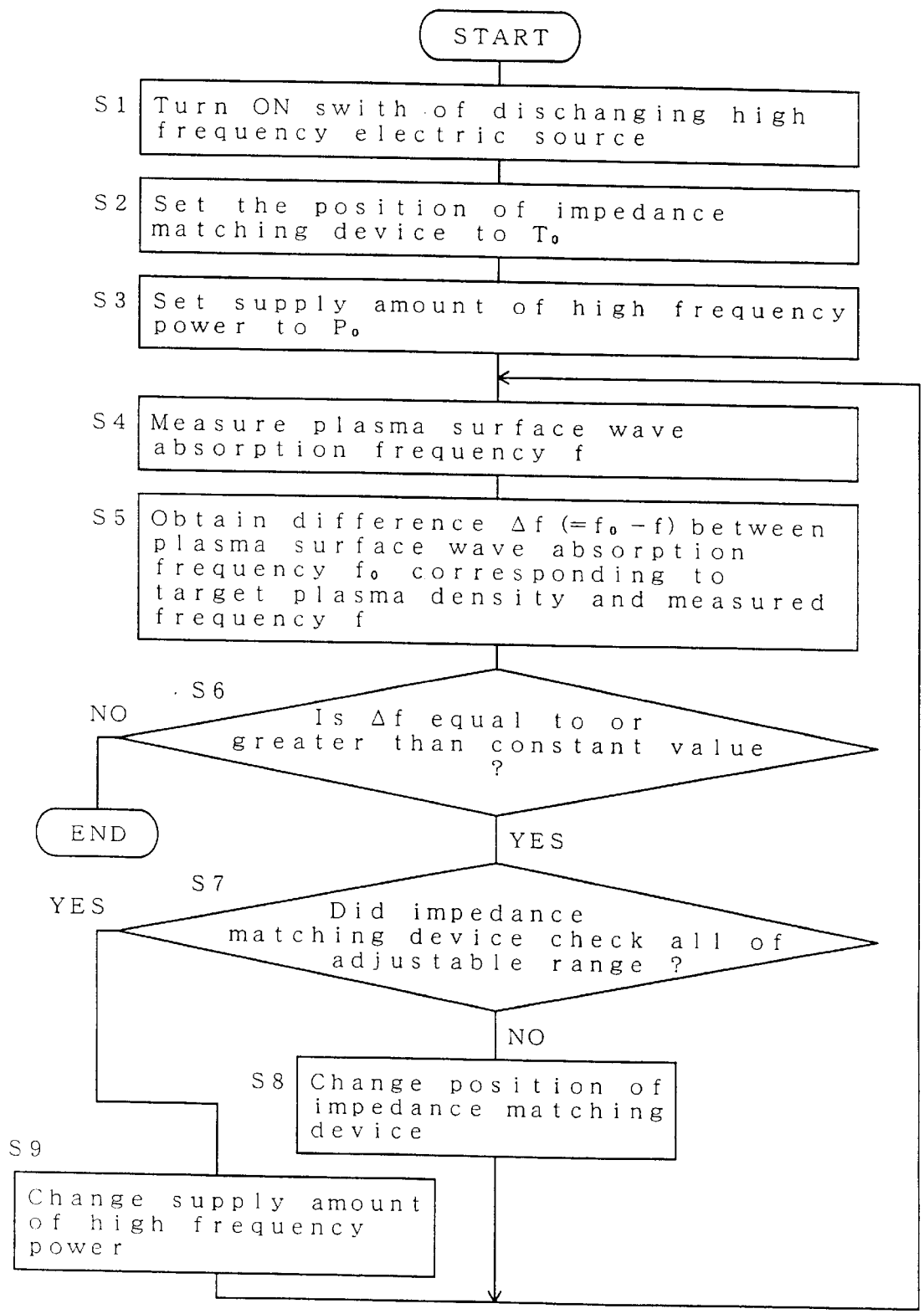
FIG. 8 is a flowchart showing a flow of control of generation high frequency power in the embodiment.

Subsequently, the operation of the apparatus when the generating high frequency power is controlled in the plasma processing system of the embodiment having the above-described structure will be explained with reference to a flowchart in FIG. 8 showing the flow of the control of the generating high frequency power.

[Step S1]

A switch of the discharging high frequency electric source 8 is turned on. At that time, the space Sin the chamber 1 is evacuated by the vacuum discharge pump 4, and gas at appropriate flow rate is supplied to the space S from the gas source 7, and the space s is adjusted into appropriate atmosphere.

[Step S2]

The impedance matching device 10a is set to appropriate initial state (e.g., the position of the tuner is set to $T_0$).

[Step S3]

The generating high frequency power is set to an appropriate value (output amount $P_0$) from the high frequency electric source 8 to the ignition electrode 2 through the impedance matching device 10a, thereby generating plasma PM in the space S of the chamber 1.

[Step S4]

When the measuring high frequency power attended with frequency sweep is applied from the high frequency oscillator 18 to the plasma PM through the loop antenna 15, the plasma surface wave resonance frequency f is obtained by the plasma absorption frequency obtaining section 22, and is sent to the matching device control section 10c.

[Step S5]

The matching device control section 10c calculates a frequency difference $\Delta f$ ($=f_0-f$) between the plasma surface wave resonance frequency $f_0$ correspond to the target plasma density and the plasma surface wave resonance frequency f corresponding to the actually measured plasma density.

[Step S6]

Judgment is made whether the frequency difference $\Delta f$ is equal to or greater then the constant value. If the frequency difference $\Delta f$ is smaller than the constant value, it is judged that the plasma density of the generated plasma PM is equal to the target plasma density, and the control process is completed.

[Step S7]

If the frequency difference $\Delta f$ is equal to or greater than the constant value, judgment is made whether all of the adjustable range of the impedance matching device 10a has been checked.

[Step S8]

When all of the adjustable rang of the impedance matching device 10a has not yet been checked, the impedance matching device 10a is adjusted again (e.g., the position of the tuner is changed to another position) and then, the procedure is returned to step S4.

[Step S9]

If the frequency difference Δf is equal to or greater than the constant value even though all of the adjustable rang of the impedance matching device 10a has been checked, the set value of the generating high frequency power output from the high frequency electric source 8 is changed and then, the procedure is returned to step S4.

As described above, the measurement of the plasma density information, the adjustment of the impedance matching device 10a and the change of the output amount of the generating high frequency power are continued such that the actually measured plasma density is converged into the target plasma density.

In the above-described system of the embodiment, the plasma-generating high frequency power is controlled in accordance with the plasma surface wave resonance frequency f obtained by the measuring system which is quite different from a supply system of the plasma-generating high frequency power. As a result, plasma density in the generated plasma excellently reflects the control of the high frequency power, the plasma density is controlled appropriately, and the work W is appropriately subjected to the plasma process.

The present invention should not be limited to the above-described embodiment, and can be modified and carried out as follows:

(1) Although the coaxial cable 16 provided at its tip end with the loop antenna 15 is covered with the dielectric tube 14 to form the measuring probe 12 in the above embodiment, the measuring probe 12 is not necessarily covered with the tube 14. That is, it is possible that a coaxial cable is formed at its tip end with the loop antenna 15 or the core wire 16a such that the loop antenna 15 or the core wire 16a projects like a needle, and the coaxial cable is directly inserted to plasma to measure the plasma density. In this case, an insulative file may be adhered to the antenna exposed to plasma. However, in the present invention, high-frequency power (electromagnetic wave) is radiated from the antenna, there is little possibility that the measurement is influenced by the insulative film adhered to the antenna.

(2) In the measuring method of the present invention, although plasma absorption frequency other than the plasma surface wave resonance frequency f is also measured, the plasma absorption frequency is also one of plasma density information. For example, as shown in FIG. 6, some plasma absorption frequencies (absorption peaks Pb, Pc, Pd) are observed, other than the plasma surface wave resonance frequency f corresponding to the absorption peak Pa. It is considered that these other plasma absorption frequencies correspond to so-called Tonks-Dattner. That is, when electromagnetic wave is radiated from outside of cylindrical plasma and power absorbed by the plasma is measured, strong absorption is caused at plurality of frequencies around the electron plasma angle frequency ωp. This phenomenon is cased as Tanks-Dattner resonance from the name of the detector. According to subsequent research, it is explained that the mechanism causing this resonance is that electron plasma wave transmitted in radial direction is excited by electromagnetic wave, and resonant absorption is caused when the excited electron plasma wave is reflected at the plasma end and standing wave is generated. Further, since there is relationship between the resonance frequency and the electron plasma angle frequency $\omega_p$, if the plasma density is varied, the Tanks-Dattner resonance frequency is also varied. That is, the Tanks-Dattner resonance frequency provides plasma density information. Therefore, it is possible to control the plasma-generating high frequency power based on the Tanks-Dattner resonance.

(3) In the case of the above embodiment, the physical amount indicative of absorption state of the frequency power by the plasma load was the reflection coefficient of the high-frequency power. In the present invention, impedance value of plasma load is also the physical amount indicative of absorption state of the frequency power by the plasma load. In this case, the counter frequency characteristics of the impedance of plasma load are measured using a channel analyzer.

(4) Although the high frequency power of the discharging high frequency electric source 8 is changed when adjustment could not be made by the impedance matching device 10a in the above-described embodiment, it is possible to adjust by changing the gas pressure supplied into the chamber 1.

(5) In another embodiment, the length L from the base end of the loop antenna 15 and the tip end of the tube 14 is arranged to be automatically changed, the plasma absorption frequency obtaining section 22 obtains variations in the counter frequencies of the reflection coefficient of the measuring high frequency power at each of the positions of the loop antenna 15, and compares the absorption peak frequencies in the plurality of measured results, thereby determining the plasma absorption frequency at which strong absorption of high frequency power is caused due to the plasma density.

(6) In the case of the above embodiment, both of the impedance matching device 10a and the high frequency electric source 8 are automatically adjusted. This can be modified such that only one of the impedance matching device 10a and the high frequency electric source 8 is automatically adjusted, and the other one is manually adjusted. Alternatively, only the impedance matching device 10a may be adjusted automatically or manually, and the high frequency electric source 8 may not be adjusted and fixed to a constant value.

(7) In the above embodiment, the tube 14 of the measuring probe 12 is detachably mounted to the wall of the chamber 1. However, this structure may be modified such that the tube 14 of the measuring probe 12 is previously fixed to the wall of the chamber 1, and whenever the measurement is carried out, the loop antenna 15, the cable 16 and the conductor piece 17 are inserted to measure.

(8) Although the single measuring probe 12 is disposed in the chamber 1 in the case of the above embodiment, this structure can be modified such that a plurality of measuring probes 12 are disposed in the chamber 1.

(9) Although the plasma density information is obtained by inserting the measuring probe 12 into plasma in the case of the above embodiment, it is not always necessary to dispose the measuring probe 12 into plasma. For example, the chamber 1 shown in FIG. 1 may be provided with a dielectric window such as heat-resistant reinforce glass or quartz, and a frequency irradiation antenna may be provided outside the window, and high-frequency power may be irradiated to plasma in the chamber 1 through this window.

(10) The shape and material of the measuring probe, and kind of the antenna of the invention should not be limited to those of the above embodiment. The plasma of interest of the present invention is not only plasma for processing, and includes plasma used for a particle beam source or an analyzing apparatus.

Figure 9:
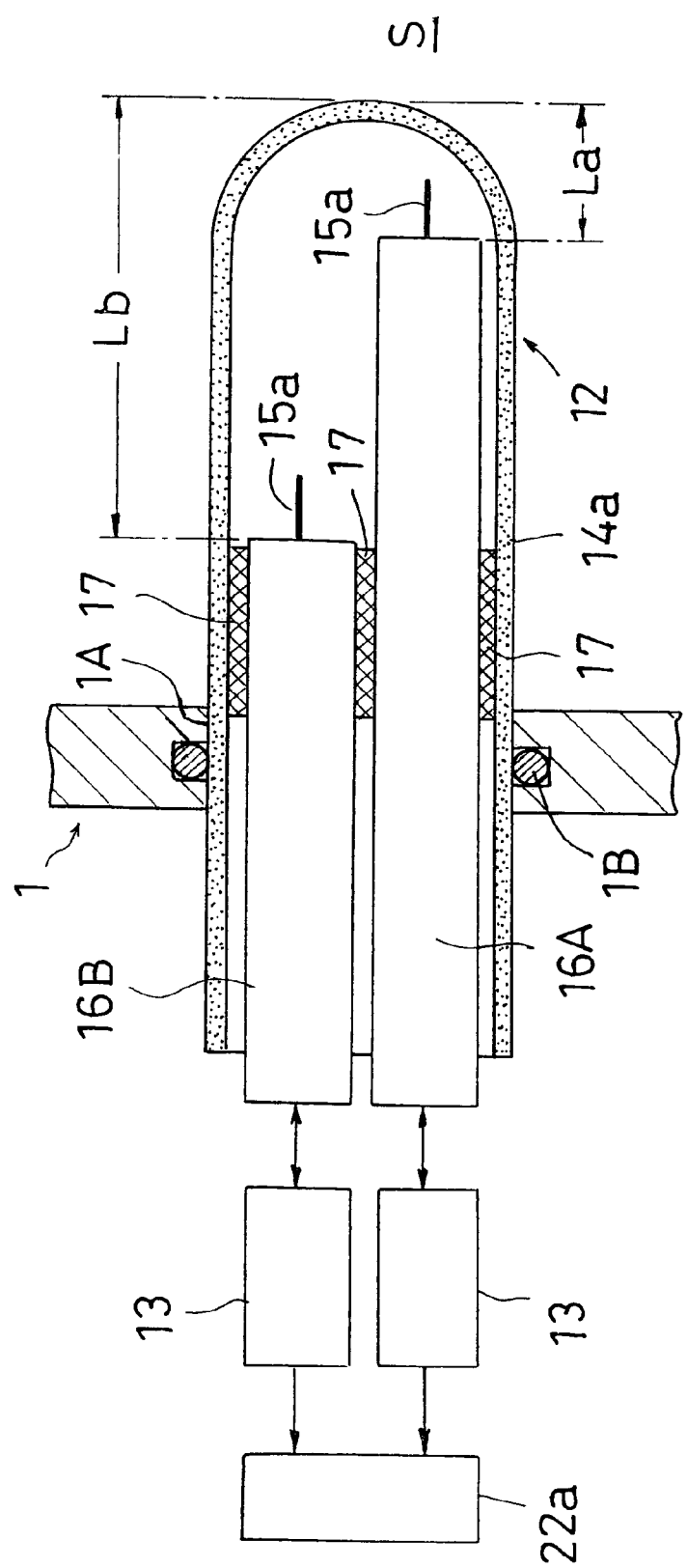
FIG. 9 is a vertical sectional view showing a modification of the measuring probe.

(11) In the above embodiment, the length L between the base end of the loop antenna 15 and the tip end of the tube 14 in the measuring probe 12 is varied, and plasma absorption frequencies of the same level are obtained at the various lengths as the plasma surface wave resonance frequency f. This structure can be modified as follows. As shown in FIG. 9, a plurality of wire-like antennas 15a and 15a as well as coaxial cables 16A and 16B are accommodated in the dielectric tube 14a such that lengths La and Lb between the antenna base end and the tip end of the tube 14 are different. Then, the plasma absorption frequency is obtained for each of the antennas by the power reflection coefficient frequency characteristic obtaining section 22 of the probe control section 13, and the plasma absorption frequency of the resonance frequency is obtained as the plasma surface wave resonance frequency f by an absorption frequency comparator 22a.

Figure 10:
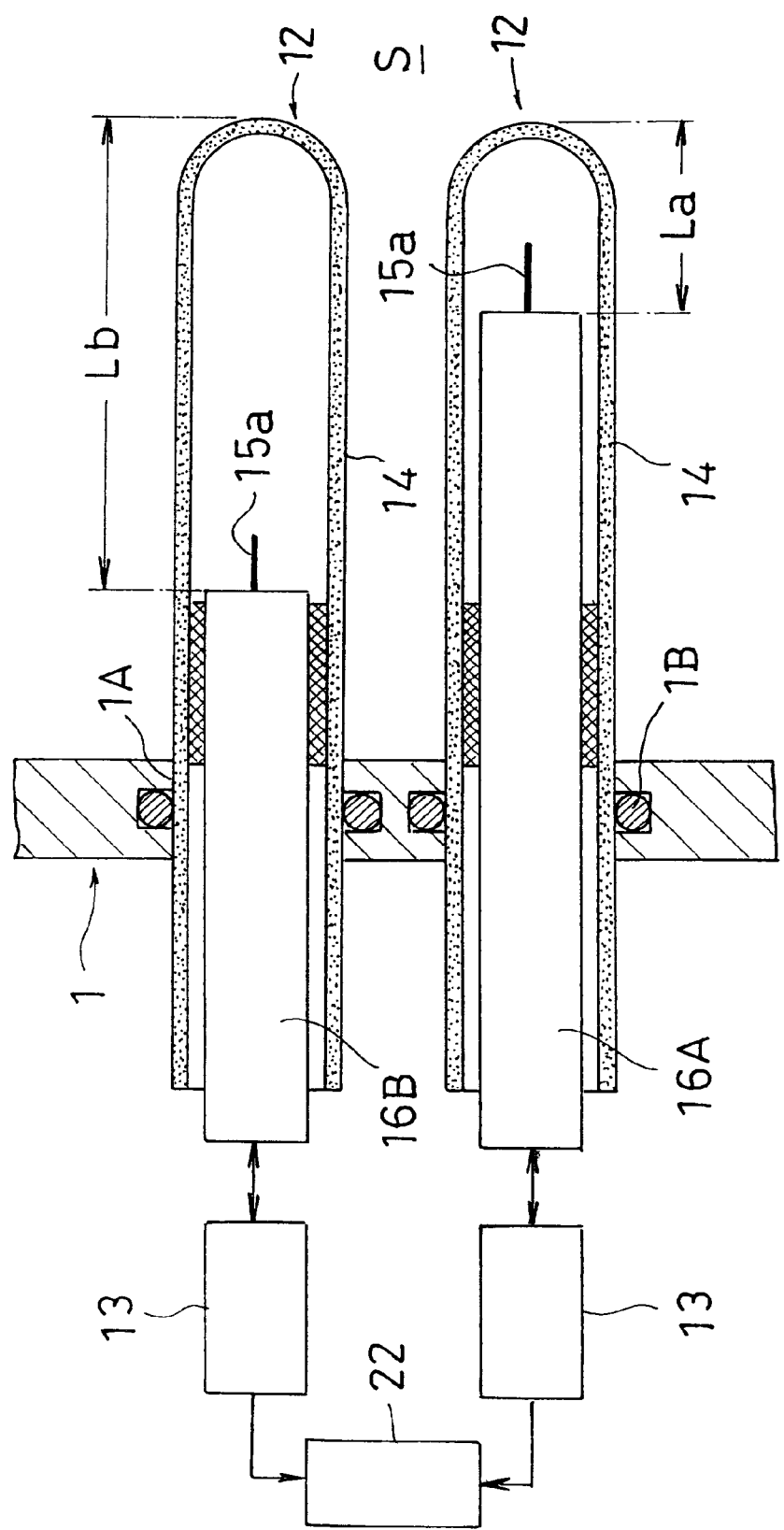
FIG. 10 is a vertical sectional view showing another modification of the measuring probe.

Alternatively, the wire-like antennas 15a, 15a and the coaxial cables 16A, 16B may not be accommodated in a single dielectric tube, and may be separately accommodated in different dielectric tubes 14, 14 as shown in FIG. 10.

With these modifications, the plasma surface wave resonance frequency f can be easily obtained even if the tip end length of the tube 14 is not varied.

(12) In the case of the above embodiment, the reflection amount of the high-frequency power for measuring the plasma density information is taken out by the directional coupler 19. This structure can be modified such that the reflection amount of the high-frequency power is measured by measuring the amount of electric current of high-frequency amplifier for supplying high-frequency power for measuring the plasma density information. The amount of electric current of the high-frequency amplifier has extremely excellent correlation with the reflection amount of the high-frequency power, and it is easy to measure the amount of electric current.

Figure 11:
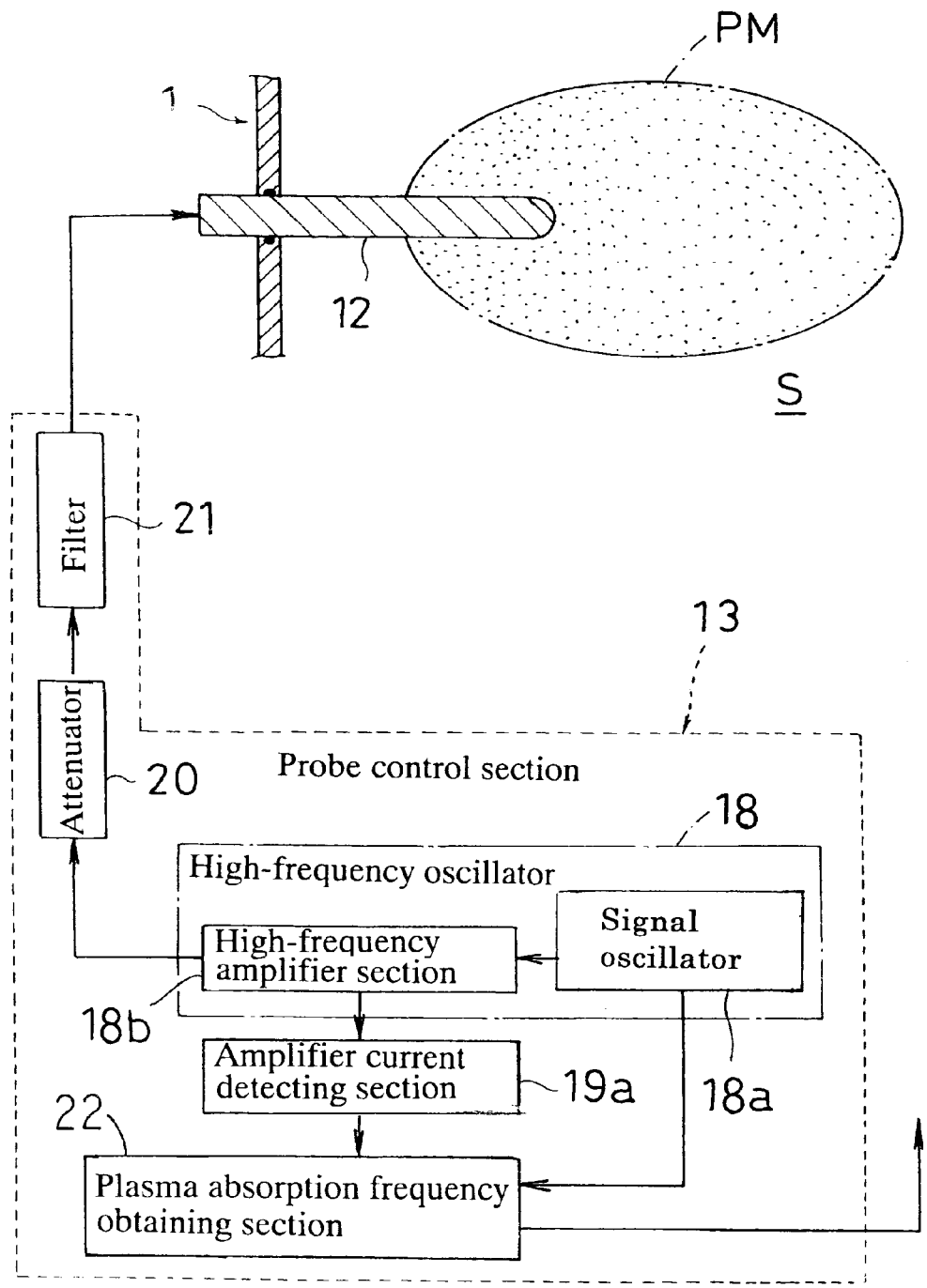
FIG. 11 is a block diagram showing a modification of a probe control section.

More specifically, as shown in FIG. 11, the amount of electric current of a high-frequency amplifier section 18b provided nest to a signal oscillator 18a of the high-frequency oscillator 18 is taken out by an amplifier current detecting section 19a, and sent to the plasma absorption frequency obtaining section 22. An example of the amplifier current detecting section 19a is a circuit structure for detecting electric current value of a driving power source of the high-frequency amplifier section 18b.

Figure 12:
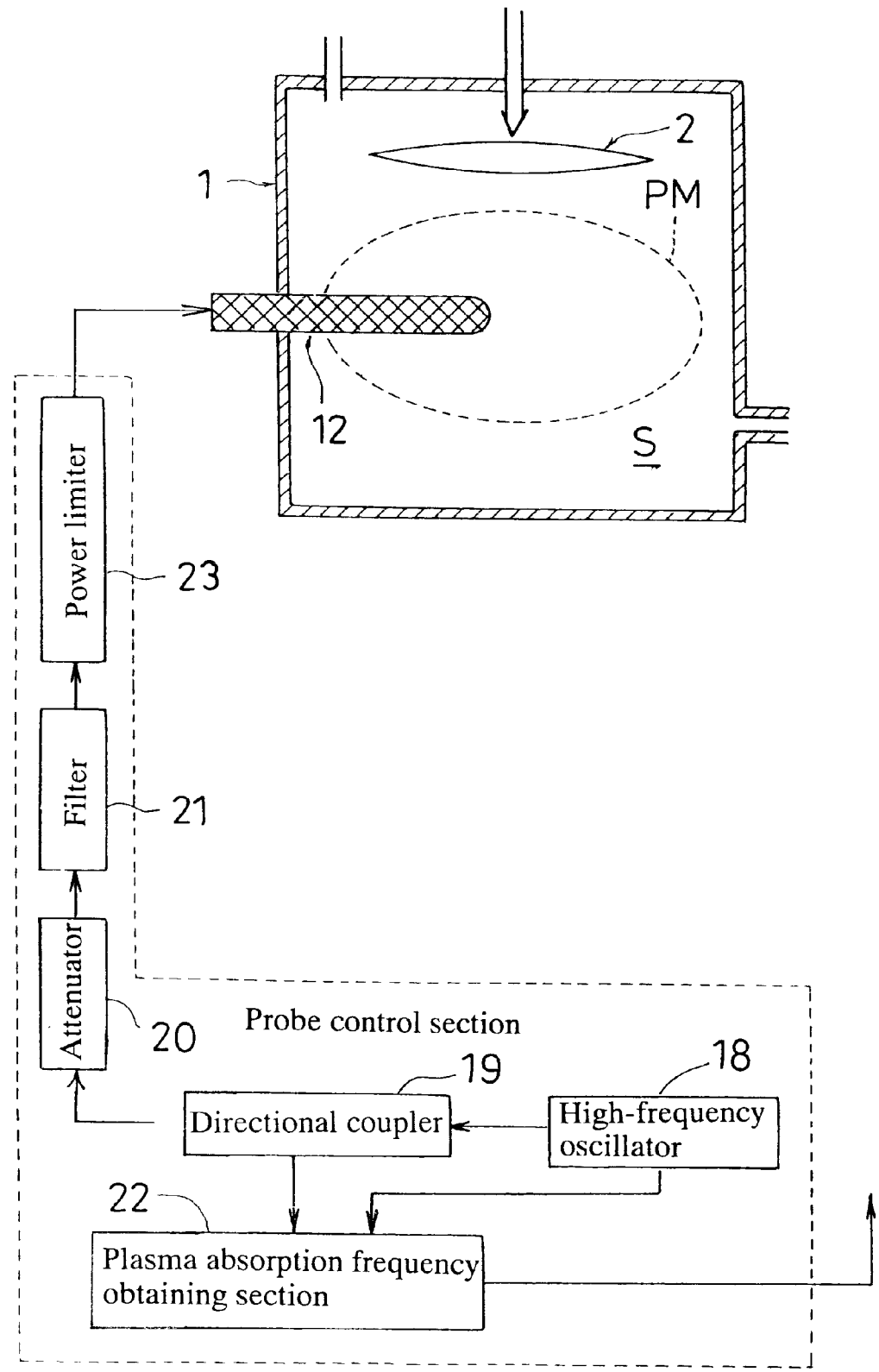
FIG. 12 is a block diagram showing another modification of the probe control section.

(13) As shown in FIG. 12, the above embodiment may be modified such that a power limiter 23 for stopping, the high-frequency power which generates excessive plasma entering to the antenna 15 in the probe is provided behind the plasma density information measuring probe 12. Especially when the plasma PM disappears unexpectedly, there is an adverse possibility that the high-frequency power for generating the plasma is directly placed on the antenna 15, and the probe control section 13 is destroyed. In this modification, the power limiter 23 prevents the excessive mixed high-frequency power from flowing into the probe control section, thereby preventing the probe control section from being destroyed.

A switch (not shown) such as a relay type coaxial switch and a semiconductor type electronic switch may be used instead of the power limiter 23. The switch may carry out the on-off operation manually. However, in order to prevent the probe control section 13 from being destroyed, it is effective that the switch can detect that the reversely flowing high-frequency exceeds a constant lever (e.g., 1.2 times of supplied high-frequency power), and the switch is automatically turned on or off, or plasma light is monitored by an optical sensor, and when the optical sensor detects that the plasma light disappears, the switch is automatically turned on or off.

(14) The above embodiment may be modified such that the measuring probe 12 is inserted for forward and backward movement into the chamber in which the plasma PM is generated, and there is provided probe moving means for moving the measuring probe 12 such that the tip end of the measuring probe 12 is pulled backward from the measuring position in the chamber 1 to a position close to the wall surface of the camber 1 when the measuring is not carried out. With this modification, even plasma generates stains thickly on the surface of the measuring probe 12, the amount of stains is reduced, and the lifetime of the measuring probe 12 is elongated.

Figure 13:
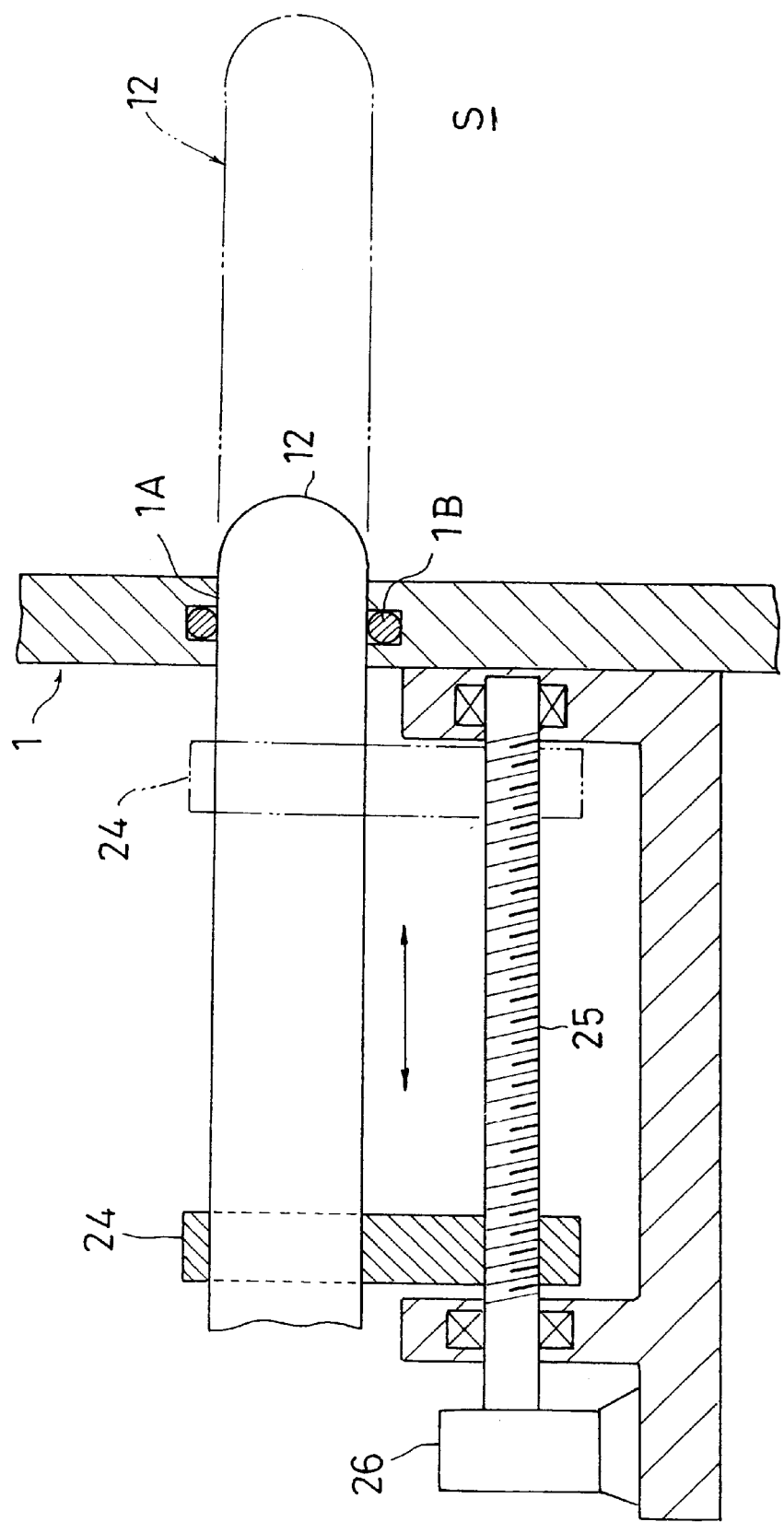
FIG. 13 is a partial sectional view showing the measuring probe and probe moving means.

More specifically, as shown in FIG. 13, the measuring probe 12 is integrally provided with a movable piece 24, the movable piece 24 is threadedly engaged to a sending screw bar 25, and as a motor 26 rotates and the sending screw bar 25 is rotated, the movable piece 24 is reciprocally moved in the longitudinal direction of the measuring probe 12. When measuring is not carried out the tip end of the measuring probe 12 is pulled backward to a retreat position in the vicinity of the wall surface of the chamber 1 as shown with a solid line in FIG. 13, and when the measuring is carried out, the motor 26 is controlled such that the tip end of the measuring probe 12 is advanced to a measuring position in the chamber 1 as shown with a dotted line in FIG. 13.

Figure 14:
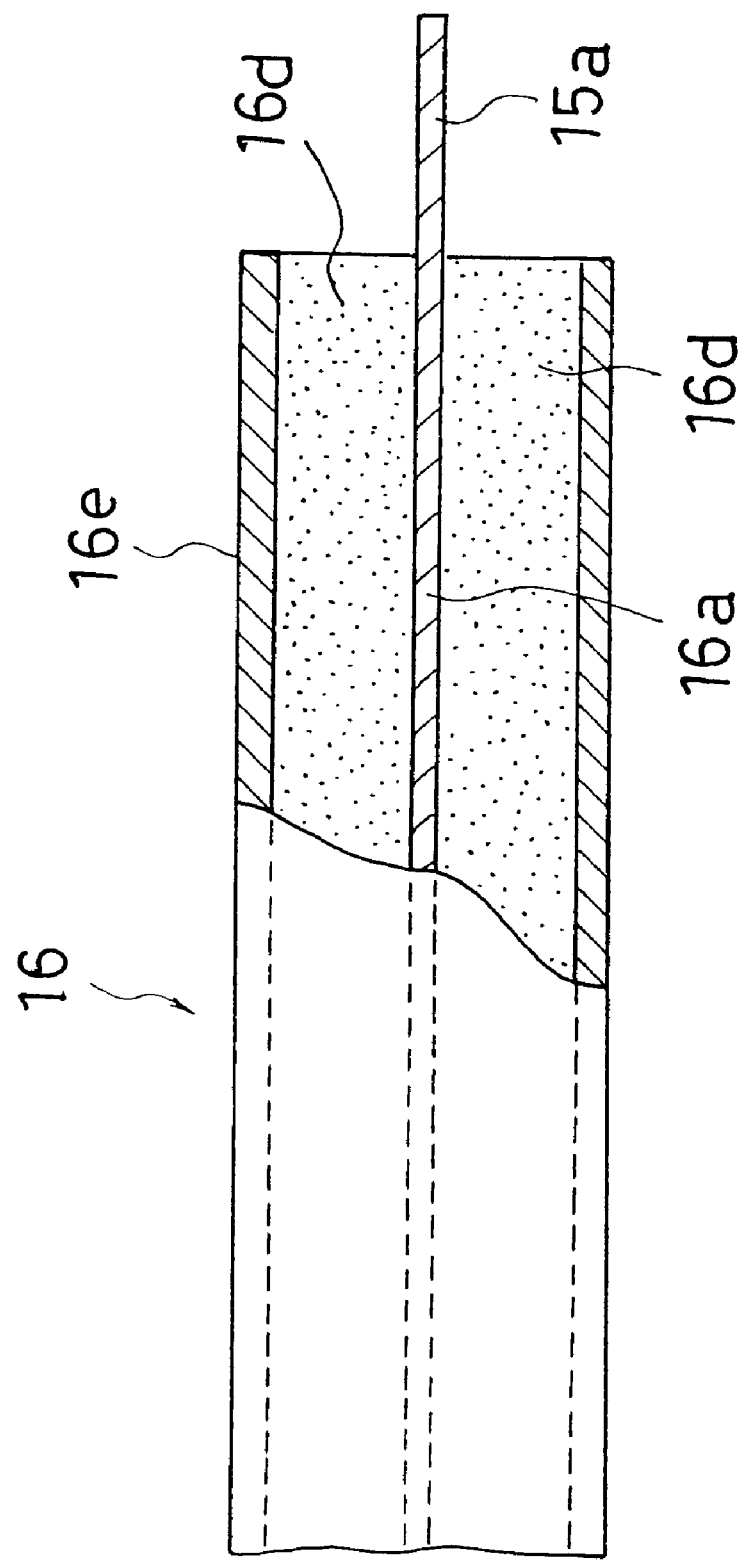
FIG. 14 is a partial vertical sectional view showing a modification of a coaxial cable.

(15) The insulative material 16c between the core wire 16a and the shield wire 16b of the coaxial cable 16 is fluorocarbon resin in the above embodiment. FIG. 14 shows a modification in which an insulative material 16d filling a gap between the core wire 16a and a conductor tube 16e for shield is heat-resistant (insulative) ceramics. In this case, the heat-resistance of the coaxial cable 16 is enhanced.

Figure 15:
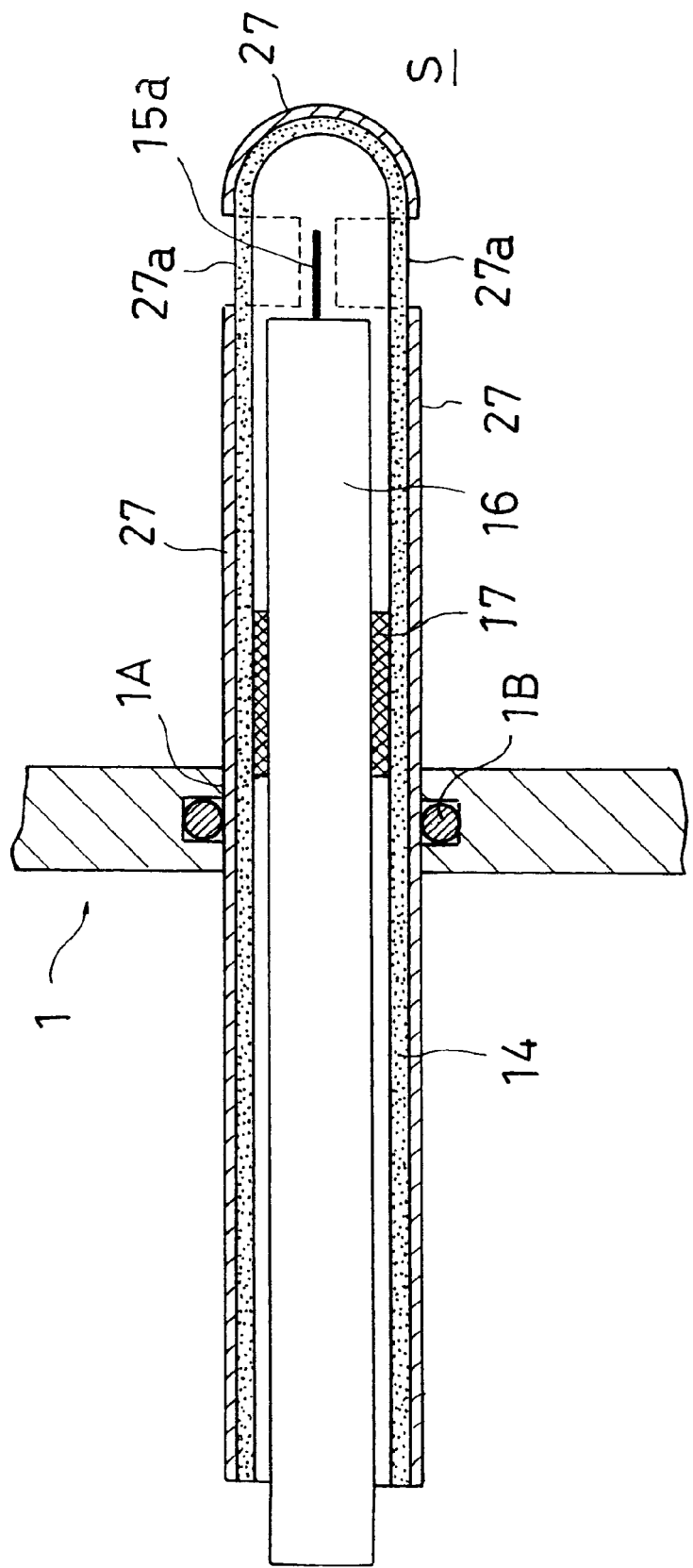
FIG. 15 is a vertical sectional view showing another modification of the measuring probe.

(16) In a measuring probe 12 of another embodiment shown in FIG. 15, a dielectric tube 14 is covered with a metal film 27 such that only a measuring region is not covered with the metal film 27. That is, a portion of the metal film 27 corresponding to the measuring region is cut out to form a window 27a. The high-frequency power does not enter the metal film 27 and can only enter the window 27a. Therefore, a local state of the measuring area that is not coated with the metal film 27 is strongly reflected to the measuring result and as a result, the spatial resolution can be enhanced.

Figure 16:
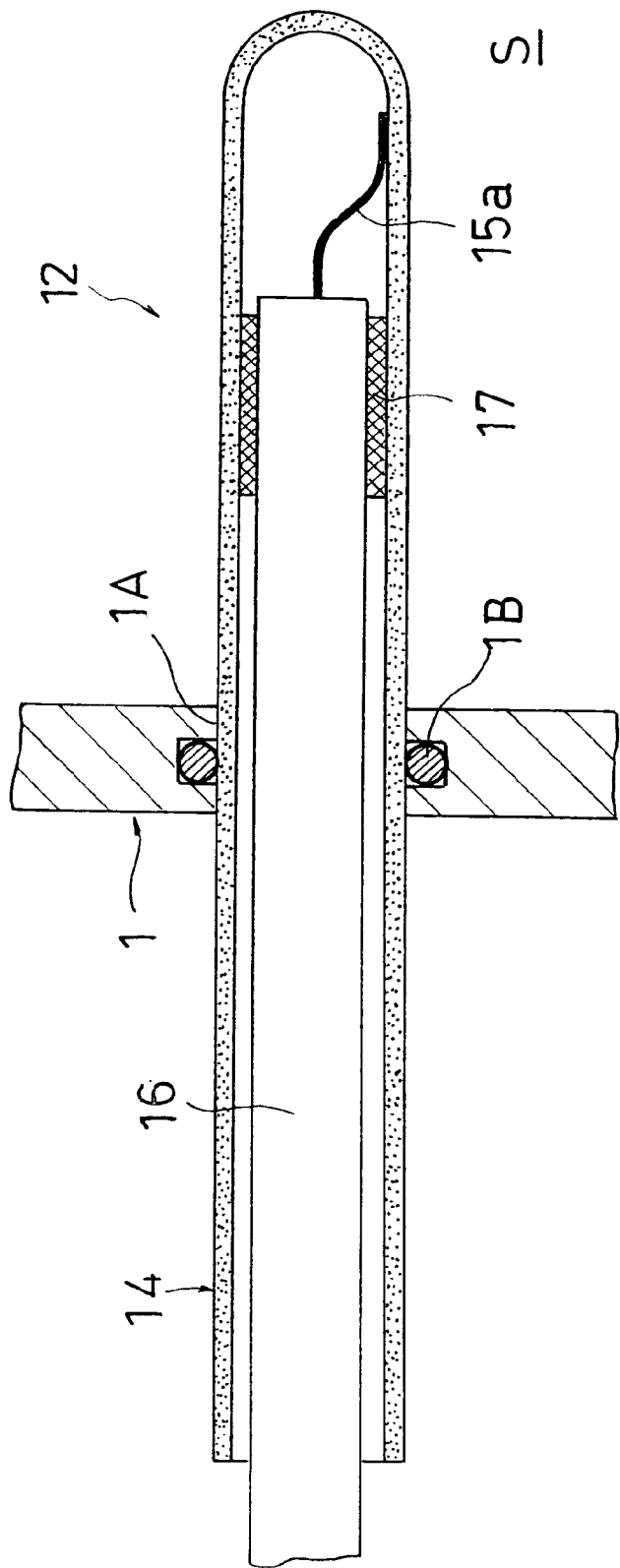
FIG. 16 is a vertical sectional view showing another modification of the measuring probe.

(17) In a measuring probe 12 of another embodiment shown in FIG. 16, the loop antenna 15 is replaced by a wire antenna 15a, and the wire antenna 15a is extended closely along the inner surface of the dielectric tube 14. With this structure, there are merits that the high-frequency power is efficiently supplied, and the required high-frequency power can be reduced, and the measuring precision is enhanced. Even with the loop antenna 15, if it is extended closely along the inner surface of the dielectric tube 14, the high-frequency power is likewise supplied efficiently.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method for controlling plasma-generating high frequency power, comprising the steps of:

supplying, to plasma, high frequency power for measuring plasma density information;

measuring a physical amount indicating reflection or absorption state of said high frequency power by plasma load;

obtaining said plasma density information based on a measured result of said physical amount; and controlling said plasma-generating high frequency power based on the obtained plasma density information.

2. A method for controlling plasma-generating high frequency power according to claims 1, wherein said high frequency power for measuring the plasma density information to said plasma through a dielectric division wall.

3. A method for controlling plasma-generating high frequency power according to claim 1, wherein said physical amount indicative of reflection or absorption state of said high-frequency power by plasma load is measured by measuring an electric current amount of a high-frequency amplifier for supplying high-frequency power.

4. A method for controlling plasma-generating high frequency power according to claim 1, wherein as said plasma density information, plasma absorption frequency at which strong absorption of high frequency power is caused due to the plasma density is obtained from the measured result of said physical amount.

5. A method for controlling plasma-generating high frequency power according to claim 1, wherein said plasma-generating high frequency power is supplied to plasma from a high frequency electric source through an impedance matching system, and said impedance matching system is controlled based on said plasma density information, thereby adjusting the impedance matching state between the electric source side and the plasma side.

6. A plasma generating apparatus, comprising:

a plasma generating chamber;

a plasma generating ignition electrode disposed in said chamber;

a high frequency electric source for outputting plasma generating high frequency power to be supplied to said ignition electrode;

plasma density information obtaining means for supplying plasma density information measuring high frequency power in said chamber to measure a physical amount indicating absorption state of high frequency power by plasma load, thereby obtaining said plasma density information; and high frequency power control means for controlling the plasma generating high frequency power based on the information obtained by said plasma density information obtaining means.

7. A plasma generating apparatus according to claim 6, wherein said plasma density information obtaining means supplies said plasma density information measuring high frequency power to said plasma in said chamber through a dielectric division wall.

8. A plasma generating apparatus according to claim 6, wherein said plasma density information obtaining means obtains, as said plasma density information, plasma absorption frequency at which strong absorption of high frequency power is caused due to the plasma density from the measured result of said physical amount.

9. A plasma generating apparatus according to claim 6, wherein said high frequency power control means is provided an impedance matching device, said impedance matching device is controlled based on said plasma density information, thereby adjusting the impedance matching state between the electric source side and the plasma side.

10. A plasma generating apparatus according to claim 7, further comprising a dielectric tube inserted into said plasma generating chamber and having a closed tip end, an antenna accommodated in said tube at its tip end side for radiating high-frequency power, and a cable accommodated in said tube at its rear side and connected to said antenna for transmitting said high-frequency power, wherein said plasma density information measuring high frequency power is supplied from an antenna in said tube to plasma through a tube wall of said dielectric tube as a dielectric division wall.

11. A plasma generating apparatus according to claim 10, wherein a plurality of antennas are accommodated in said dielectric tube such that distances between a tip end of said tube and said antennas are different from one another, said plasma density information obtaining means obtains plasma absorption frequencies at which strong absorption of high frequency power are caused due to plasma density from the measured result of the physical amount obtained in each of the antennas, and among the plasma absorption frequencies, one having the common frequency is obtained as the plasma surface wave resonance frequency.

12. A plasma generating apparatus according to claim 10, wherein a plasma density information measuring probe is inserted in a chamber which generates plasma for forward and backward movement, and said probe is moved such that a tip end of said probe is pulled backward from a measuring position in said chamber to a retreat position in the vicinity of a wall surface of said chamber when measurement is not carried out.

13. A plasma generating apparatus according to claim 10, wherein protecting means for blocking excessive plasma generating high-frequency power which enters said antenna in said probe is provided behind said plasma density information measuring probe.

14. A plasma generating apparatus according to claim 10, wherein said cable for transmitting high-frequency power comprises a conductor tube for a core wire and a shield, and an insulative ceramics material for filling a gap between said core wire and said conductor tube.

15. A plasma generating apparatus according to claim 10, wherein a surface of said dielectric tube is coated with metal such that a measuring area of said dielectric tube is not coated.

16. A plasma generating apparatus according to claim 10, wherein said antenna is extended closely along an inner surface of said dielectric tube.

\* \* \* \* \*